(12) United States Patent
Mitsunari

(10) Patent No.: US 8,862,441 B2
(45) Date of Patent: Oct. 14, 2014

(54) PROCESSING SUPPORT DEVICE, METHOD AND COMPUTER READABLE STORAGE MEDIUM, AND SEMICONDUCTOR FABRICATION SUPPORT DEVICE AND METHOD

(75) Inventor: Haruki Mitsunari, Miyazaki (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 359 days.

(21) Appl. No.: 13/420,756

(22) Filed: Mar. 15, 2012

(65) Prior Publication Data

US 2012/0253759 A1    Oct. 4, 2012

(30) Foreign Application Priority Data

Mar. 30, 2011 (JP) ................ 2011-076626

(51) Int. Cl.
*G06F 7/60* (2006.01)
*G06F 17/10* (2006.01)
*G03F 7/20* (2006.01)
*G06F 17/50* (2006.01)
*B24B 51/00* (2006.01)
*H01L 21/67* (2006.01)

(52) U.S. Cl.
CPC ............ *G06F 17/10* (2013.01); *G03F 7/70483* (2013.01); *G06F 17/50* (2013.01); *B24B 51/00* (2013.01); *H01L 21/67276* (2013.01)
USPC .......................................................... 703/2

(58) Field of Classification Search
USPC .......................................................... 703/2
See application file for complete search history.

(56) References Cited

U.S. PATENT DOCUMENTS 5,164,905 A * 11/1992 Iwasaki et al. ................ 700/112

FOREIGN PATENT DOCUMENTS

| JP | 06-291006 | 10/1994 |
| JP | 2001-209421 | 8/2001 |

* cited by examiner

*Primary Examiner* — Saif Alhija
(74) *Attorney, Agent, or Firm* — Volentine & Whitt, PLLC

(57) ABSTRACT

Using an equipment-classified processing results database, an intercept satisfying a second predetermined condition is derived from intercepts of straight lines that pass through a reference co-ordinate point, which satisfies a first predetermined condition, and respective co-ordinate points in a region bounded by: a line that passes through the reference co-ordinate point and is parallel to an x-axis representing wafer counts X; a y-axis representing processing durations Y; and a line passing through the reference co-ordinate point and the origin. Of co-ordinate points represented by an equipment and recipe-classified processing results database, a gradient satisfying a third predetermined condition is derived from gradients of lines that pass through the derived intercept and each of all co-ordinate points with wafer counts X at or above a predetermined number. A processing duration is derived using a regression equation into which the derived intercept and the derived gradient are substituted.

16 Claims, 16 Drawing Sheets

FIG.3

| PROCESSING START | PROCESSING END | EQUIPMENT NAME | NUMBER OF WAFERS | RECIPE | PROCESSING DURATION |
|---|---|---|---|---|---|
| 20yy/m1/28 23:56:00 | 20yy/m1/29 1:05:00 | LP04 | 10 | 081ALP | 1:09 |
| 20yy/m1/28 23:52:00 | 20yy/m1/29 1:36:00 | LP08 | 27 | 015ALP | 1:44 |
| 20yy/m1/28 23:05:00 | 20yy/m1/29 1:42:00 | LP05 | 50 | 046ALP | 2:37 |
| 20yy/m1/29 1:44:00 | 20yy/m1/29 2:12:00 | LP05 | 2 | 045ALP | 0:28 |
| 20yy/m1/29 1:38:00 | 20yy/m1/29 4:21:00 | LP08 | 50 | 048ALP | 2:43 |
| 20yy/m1/29 2:16:00 | 20yy/m1/29 4:55:00 | LP05 | 50 | 045ALP | 2:39 |
| 20yy/m1/29 1:39:00 | 20yy/m1/29 6:27:00 | LP04 | 50 | 081ALP | 4:48 |
| 20yy/m1/29 5:26:00 | 20yy/m1/29 6:43:00 | LP08 | 50 | 034ALP | 1:17 |
| 20yy/m1/29 4:56:00 | 20yy/m1/29 7:39:00 | LP05 | 50 | 068ALP | 2:43 |
| 20yy/m1/29 7:40:00 | 20yy/m1/29 8:13:00 | LP05 | 3 | 045ALP | 0:33 |
| 20yy/m1/29 6:45:00 | 20yy/m1/29 9:35:00 | LP08 | 50 | 048ALP | 2:50 |
| 20yy/m1/29 6:29:00 | 20yy/m1/29 10:27:00 | LP04 | 48 | 081ALP | 3:58 |
| 20yy/m1/29 8:16:00 | 20yy/m1/29 11:03:00 | LP08 | 50 | 048ALP | 2:47 |
| 20yy/m1/29 9:36:00 | 20yy/m1/29 12:20:00 | LP04 | 50 | 046ALP | 2:44 |
| 20yy/m1/29 10:30:00 | 20yy/m1/29 14:37:00 | LP04 | 49 | 081ALP | 4:07 |
| 20yy/m1/29 11:04:00 | 20yy/m1/29 14:57:00 | LP05 | 50 | 081ALP | 3:53 |
| 20yy/m1/29 12:21:00 | 20yy/m1/29 16:23:00 | LP08 | 50 | 081ALP | 4:02 |
| 20yy/m1/29 16:25:00 | 20yy/m1/29 17:20:00 | LP08 | 9 | 034ALP | 0:55 |
| 20yy/m1/29 15:00:00 | 20yy/m1/29 17:40:00 | LP05 | 50 | 039ALP | 2:40 |

FIG.7

| INPUT PROCESSING RESULTS DATA: | |
|---|---|
| PROCESSING START | 20yy/m1/28 23:56 |
| PROCESSING END | 20yy/m1/29 1:05 |
| EQUIPMENT NAME | LP04 |
| WAFERS IN ONE LOT | 10 |
| RECIPE | 081ALD |
| PROCESSING DURATION | 1:09 |

10F

END

FIG.9

| | | |
|---|---|---|
| INPUT PREDICTION CONDITIONS: | | |
| EQUIPMENT NAME | LP04 | |
| WAFERS IN ONE LOT | 48 | |
| RECIPE | 081ALD | |
| | | END |

| INPUTTED PREDICTION CONDITIONS | |
|---|---|
| EQUIPMENT NAME | LP04 |
| WAFERS IN ONE LOT | 48 |
| RECIPE | 081ALD |

SCHEDULED PROCESSING DURATION

2:56

END

| | | |
|---|---|---|
| INPUTTED PREDICTION CONDITIONS | | 10F |
| EQUIPMENT NAME | LP04 | |
| WAFERS IN ONE LOT | 48 | |
| RECIPE | 081ALD | |

SCHEDULED ARRIVAL TIME

20yy/m2/6 17:00

END

FIG.16

| INPUTTED PREDICTION CONDITIONS | | |
|---|---|---|
| EQUIPMENT NAME | LP04 | |
| WAFERS IN ONE LOT | 48 | |
| RECIPE | 081ALD | |
| SCHEDULED PROCESSING DURATION | RELIABILITY OF SCHEDULED PROCESSING DURATION | |
| 2:56 | 80% | |
| | | END |

~10F

PROCESSING SUPPORT DEVICE, METHOD AND COMPUTER READABLE STORAGE MEDIUM, AND SEMICONDUCTOR FABRICATION SUPPORT DEVICE AND METHOD

CROSS-REFERENCE TO RELATED APPLICATION

This application is based on and claims priority under 35 USC 119 from Japanese Patent Application No. 2011-076626 filed on Mar. 30, 2011, the disclosure of which is incorporated by reference herein.

BACKGROUND

1. Technical Field

The present invention relates to a processing support device, method and a computer readable storage medium, and a semiconductor fabrication support device and method, and more specifically relates to a processing support device, method and a computer readable storage medium, and a semiconductor fabrication support device and method for a fabrication line that applies predetermined processing to targets with predetermined equipment.

2. Related Art

Systems of equipment for applying predetermined processing to plural numbers of semiconductor wafers constituting individual lots (lot processing) fall into two categories. One category is batch systems that simultaneously process all the semiconductor wafers included in a lot at one time, and the other category is single-wafer systems that process the semiconductor wafers included in a lot one at a time.

For a piece of equipment in any kind of system, a processing duration required for processing a lot may be ascertained by, for example, measuring a duration from when a start signal indicating that lot processing has started is inputted to when an end signal indicating that the lot processing has finished is inputted. A duration required for lot processing, a schedule of processing to be conducted before and after the lot processing, and suchlike may be administered using a duration that is measured in this manner.

For example, Japanese Patent Application Laid-Open (JP-A) No. 6-291006 discloses a technology with the object of improving fabrication performance of a semiconductor fabrication line. This technology predicts a completion duration of processing of a step on the basis of previous processing durations, and starts processing of a previous step so as to be in time for the completion duration. However, JP-A No. 6-291006 does not specifically disclose how a processing completion duration of a step is predicted on the basis of previous processing durations. Consequently, specifying the processing start time of the previous step is difficult in practice.

JP-A No. 2001-209421 discloses a technology with the object of predicting a completion duration of lot processing. This technology defines processing durations of respective operations in accordance with structures and operations of equipment and, through complex calculations, predicts a duration of lot processing.

However, although the technology recited in JP-A No. 2001-209421 may predict a completion duration of lot processing, extremely complicated calculations are required for predicting the processing duration. Therefore, if support is conducted using the processing recited in JP-A No. 2001-209421 to perform lot processing in accordance with a scheduled duration, complicated calculations must be carried out.

Apart from cases of executing processing relating to semiconductors, similar problems also arise when, for example, the technology recited in JP-A No. 2001-209421 is used when some kind of processing is applied to processing targets other than semiconductors.

SUMMARY

The present invention has been made in order to solve the problem described above, and an object of the invention is to provide a processing support device, method and a computer readable storage medium, and a semiconductor fabrication support device and method that are capable of simply and accurately supporting the application of predetermined processing to processing targets by predetermined equipment in accordance with a scheduled duration.

A processing support device according to the first aspect of the present invention includes: a memory section that stores first two-dimensional co-ordinate data that represents processing object unit counts X of processing targets to which predetermined processing is applied by predetermined equipment and processing durations Y required for the processing of the unit counts X of the processing targets as co-ordinate points in two dimensions, and second two-dimensional co-ordinate data that represents unit counts X and processing durations Y for individual types of the processing as co-ordinate points in two dimensions; an intercept derivation section that derives an intercept b of a regression equation expressed as the following expression (1)

$$Y = aX + b \quad (1)$$

in which the unit count X is an independent variable, the processing duration Y is a dependent variable, and b is an intercept and a is a gradient particular to the equipment, the intercept b being an intercept that satisfies a second condition among intercepts of lines that pass through a reference co-ordinate point and respective co-ordinate points in a region, the reference co-ordinate point satisfying a first predetermined condition among the co-ordinate points represented by the first two-dimensional co-ordinate data stored in the memory section, and the region being bounded by a line that passes through the reference co-ordinate point and is parallel to an x-axis representing the unit counts X, a y-axis representing the processing durations Y and a line that passes through the reference co-ordinate point and the origin; a gradient derivation section that derives the gradient a, the gradient a being a gradient of a line that satisfies a third predetermined condition among gradients of lines that pass through the intercept b derived by the intercept derivation section and each of all co-ordinate points with a unit count X greater than or equal to a predetermined number among the co-ordinate points represented by the second two-dimensional co-ordinate data stored in the memory section; and a support section that supports the processing using expression (1), into which the intercept b derived by the intercept derivation section and the gradient a derived by the gradient derivation section are substituted.

According to the thirteenth aspect of the present invention, a semiconductor fabrication support device includes: a processing support device according to any one of the first to twelfth aspects; and a prediction section that predicts an end time of processing using the support section, wherein the processing targets are semiconductors.

According to the sixteenth aspect of the present invention a processing support method includes: registering, by storing in a memory section, first two-dimensional co-ordinate data that represents processing object unit counts X of processing targets to which predetermined processing is applied by predetermined equipment and processing durations Y required for the processing of the unit counts X of the processing targets as co-ordinate points in two dimensions, and second two-dimensional co-ordinate data that represents unit counts X and processing durations Y for individual types of the processing as co-ordinate points in two dimensions; deriving an intercept b of a regression equation expressed as the following expression (1)

$$Y=aX+b \quad (1)$$

in which the unit count X is an independent variable, the processing duration Y is a dependent variable, and b is an intercept and a is a gradient particular to the equipment, the intercept b being an intercept that satisfies a second condition among intercepts of lines that pass through a reference co-ordinate point and respective co-ordinates in a region, the reference co-ordinate point satisfying a first predetermined condition among the co-ordinate points represented by the first two-dimensional co-ordinate data stored in the memory section, and the region being bounded by a line that passes through the reference co-ordinate point and is parallel to an x-axis representing the unit counts X, a y-axis representing the processing durations Y and a line that passes through the reference co-ordinate point and the origin; deriving the gradient a, the gradient a being a gradient of a line that satisfies a third predetermined condition among gradients of lines that pass through the derived intercept b and each of all co-ordinate points with a unit count X greater than or equal to a predetermined number among the co-ordinate points represented by the second two-dimensional co-ordinate data stored in the memory section; and supporting the processing using expression (1), into which the derived intercept b and the derived gradient a are substituted.

According to the twenty-eighth aspect of the present invention, there is provided a semiconductor fabrication support method including: a processing support method according to any one of the sixteenth to the twenty-seventh aspects; and predicting an end time of processing, by the supporting step, wherein the processing targets are semiconductors.

According to the thirty-first aspect of the present invention, there is provided a non-transitory computer readable medium storing a program causing a computer to execute a process for supporting processing, the process includes: registering, by storing in a memory section, first two-dimensional co-ordinate data that represents processing object unit counts X of processing targets to which predetermined processing is applied by predetermined equipment and processing durations Y required for the processing of the unit counts X of the processing targets as co-ordinate points in two dimensions, and second two-dimensional co-ordinate data that represents unit counts X and processing durations Y for individual types of the processing as co-ordinate points in two dimensions; deriving an intercept b of a regression equation expressed as the following expression (1)

$$Y=aX+b \quad (1)$$

in which the unit count X is an independent variable, the processing duration Y is a dependent variable, and b is an intercept and a is a gradient particular to the equipment, the intercept b being an intercept that satisfies a second condition among intercepts of lines that pass through a reference co-ordinate point and respective co-ordinates in a region, the reference co-ordinate point satisfying a first predetermined condition among the co-ordinate points represented by the first two-dimensional co-ordinate data stored in the memory section, and the region being bounded by a line that passes through the reference co-ordinate point and is parallel to an x-axis representing the unit counts X, a y-axis representing the processing durations Y and a line that passes through the reference co-ordinate point and the origin; deriving the gradient a, the gradient a being a gradient of a line that satisfies a third predetermined condition among gradients of lines that pass through the derived intercept b and each of all co-ordinate points with a unit count X greater than or equal to a predetermined number among the co-ordinate points represented by the second two-dimensional co-ordinate data stored in the memory section; and supporting the processing using expression (1), into which the derived intercept b and the derived gradient a are substituted.

According to the present invention, an advantageous effect is provided in that the application of predetermined processing to processing targets by predetermined equipment in accordance with a scheduled duration may be simply and accurately supported.

BRIEF DESCRIPTION OF THE DRAWINGS

Exemplary embodiments of the present invention will be described in detail based on the following figures, wherein:

FIG. 3 is a schematic diagram illustrating principal memory contents of a processing results database relating to the exemplary embodiment.

FIG. 7 is a schematic diagram illustrating an example of a processing results registration screen relating to the exemplary embodiment.

FIG. 9 is a schematic diagram illustrating an example of a prediction condition input screen relating to the exemplary embodiment.

FIG. 13 is a (first) schematic diagram illustrating an example of a display state of a display of the fabrication processing device relating to the exemplary embodiment.

FIG. 14 is a (second) schematic diagram illustrating an example of a display state of the display of the fabrication processing device relating to the exemplary embodiment.

FIG. 16 is a (fourth) schematic diagram illustrating an example of a display state of the display of the fabrication processing device relating to the exemplary embodiment.

DETAILED DESCRIPTION

Herebelow, an example of a mode for embodying the present invention is described in detail with reference to the attached drawings. In the present exemplary embodiment, an example of a mode in which fabrication of semiconductor wafers by a fabrication line, which includes a number of processing steps, is supported is described. Pieces of equipment that carry out the corresponding processing one machine after another in the processing steps are provided on the fabrication line.

Figure 1:
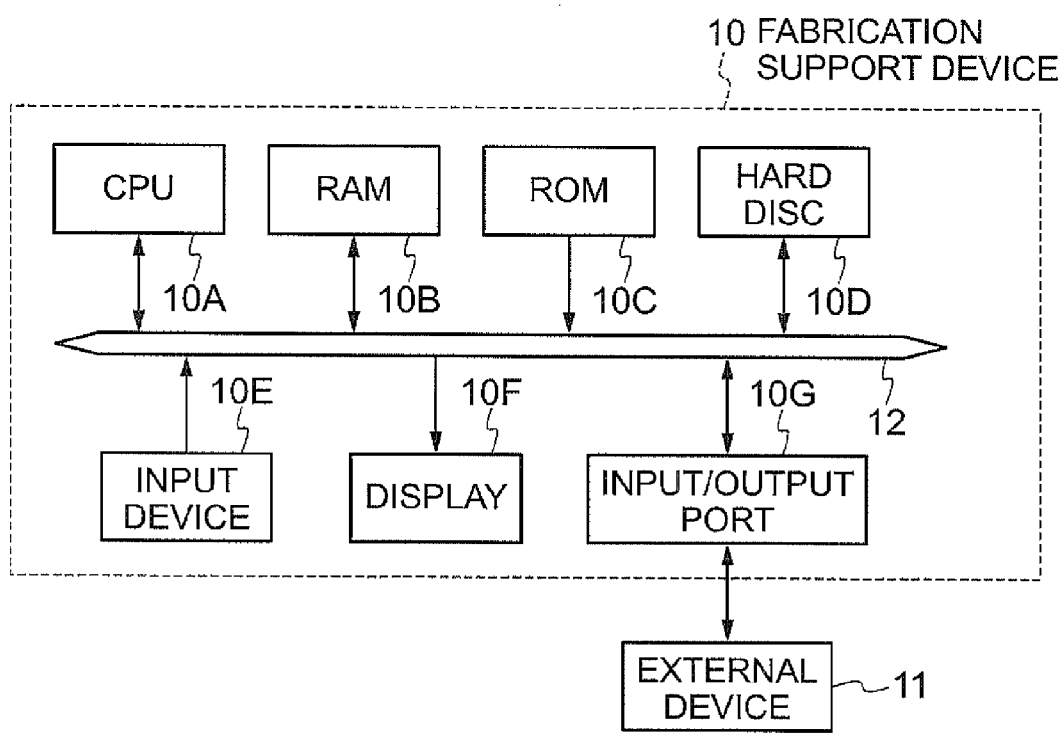
FIG. 1 is a block diagram illustrating an example of structure of a fabrication processing device relating to an exemplary embodiment.

FIG. 1 is a block diagram illustrating an example of principal structures of an electronic system of a fabrication support device 10 relating to the present exemplary embodiment. The fabrication support device 10 relating to the present exemplary embodiment supports the fabrication of semiconductor wafers at a fabrication line by predicting durations required for processing carried out by each of the plural pieces of equipment that constitute the fabrication line (which are, for example, conveyance robots, grinding machines and the like), and displaying the prediction results. The fabrication support device 10 is equipped with a central processing unit (CPU) 10A, a random access memory (RAM) 10B, a read-only memory (ROM) 10C, a hard disc 10D, an input device 10E, a display 10F and an input/output port 10G. The CPU 10A oversees overall operations of the fabrication support device 10. The RAM 10B is used as a work area during execution of various processing programs by the CPU 10A, and the like. Various processing programs and various parameters and the like are pre-stored in the ROM 10C. The hard disc 10D is used for storing various kinds of data. The input device 10E includes a keyboard and mouse or the like to be used for inputting various kinds of data. The display 10F is used for displaying various kinds of data. The input/output port 10G exchanges various kinds of data with an external device 11 (for example, a personal computer) through a communications unit (for example, a local area network (LAN)). These components are connected to one another by a bus 12.

Thus, the CPU 10A may access the RAM 10B, the ROM 10C and the hard disc 10D, acquire various kinds of input data via the input device 10E, display various kinds of data at the display 10F and, via the input/output port 10G, exchange various kinds of data with the external device 11 connected to the communications unit.

Figure 2:
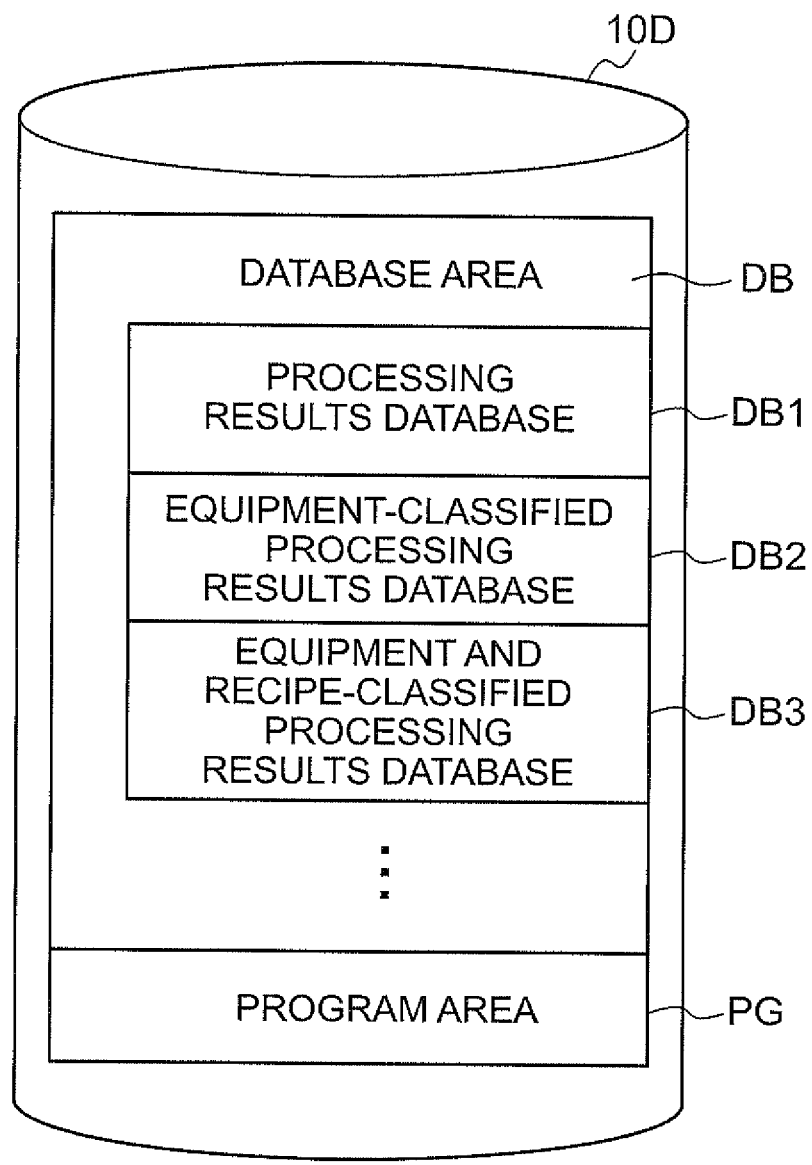
FIG. 2 is a schematic diagram illustrating principal memory contents of a hard disc of the fabrication processing device relating to the exemplary embodiment.

FIG. 2 schematically illustrates principal memory contents of the hard disc 10D.

As illustrated in FIG. 2, the hard disc 10D is provided with a database area DB, which is for storing various databases, and a program area PG, which is for storing a control program for controlling the fabrication support device 10, various programs for carrying out various kinds of processing, and the like.

The database area DB includes a processing results database DB1, representing results of processing by the fabrication line (processing results), an equipment-classified processing results database DB2 representing processing results for individual pieces of equipment, and an equipment and recipe-classified processing results database DB3 representing processing results for individual recipes at each piece of equipment.

Herebelow, structures of these databases are described in detail with reference to the drawings.

As illustrated in FIG. 3, the processing results database DB1 relating to the present exemplary embodiment is constituted by the following data being associated with one another and stored in the database area DB: processing start data representing a date and time at which processing by specific equipment started according to the judgment of an administrator; processing end data representing the date and time at which the processing by the specific equipment ended according to the judgment of an administrator; equipment name data representing the specific piece of equipment; wafer count data indicating the number of semiconductor wafers (the number of individual units) constituting a single lot; recipe data representing a recipe associated with the processing by the specific equipment (conditions determined by the fabricated product and steps); and processing duration data which is the duration required for the processing by the specific equipment. In the descriptions below, the data stored in the processing results database DB1—that is, the processing start data, processing end data, equipment name data, wafer count data, recipe data and processing duration—are referred to as processing results data where there is no need to distinguish therebetween.

Figure 4:
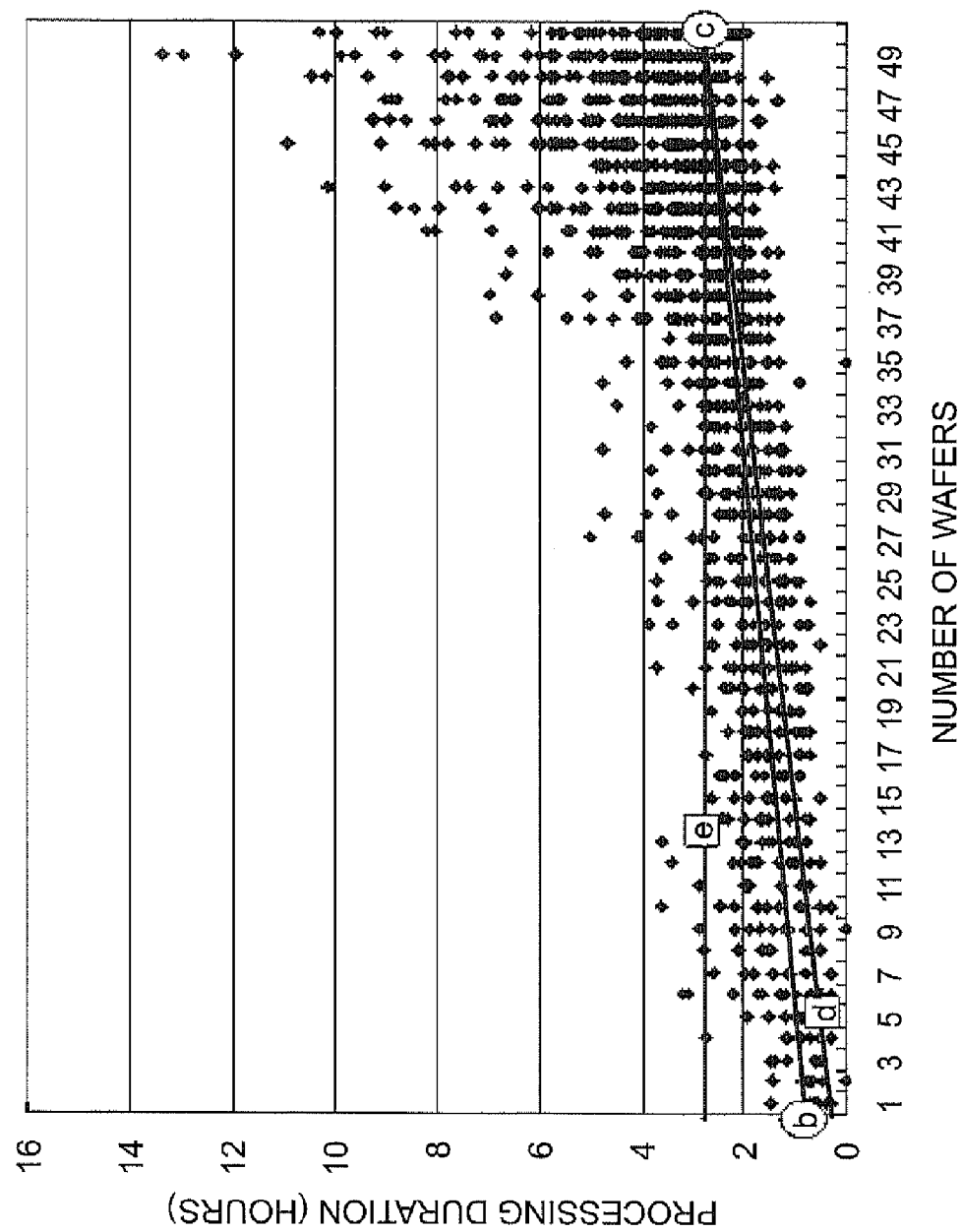
FIG. 4 is a distribution plot representing principal memory contents of an equipment-classified processing results database relating to the exemplary embodiment as two-dimensional co-ordinates.

The equipment-classified processing results database DB2 relating to the present exemplary embodiment is constructed by two-dimensional co-ordinates being stored in the database area for each type of equipment name data. With the wafer count data and processing durations that are stored in the processing results database DB1 as objects, the wafer counts represented by the wafer count data are represented by x co-ordinates and the processing durations corresponding to the wafer count data records are represented by y co-ordinates. FIG. 4 shows an example of a distribution plot illustrating a distribution of two-dimensional co-ordinates stored in the equipment-classified processing results database DB2.

Figure 5:
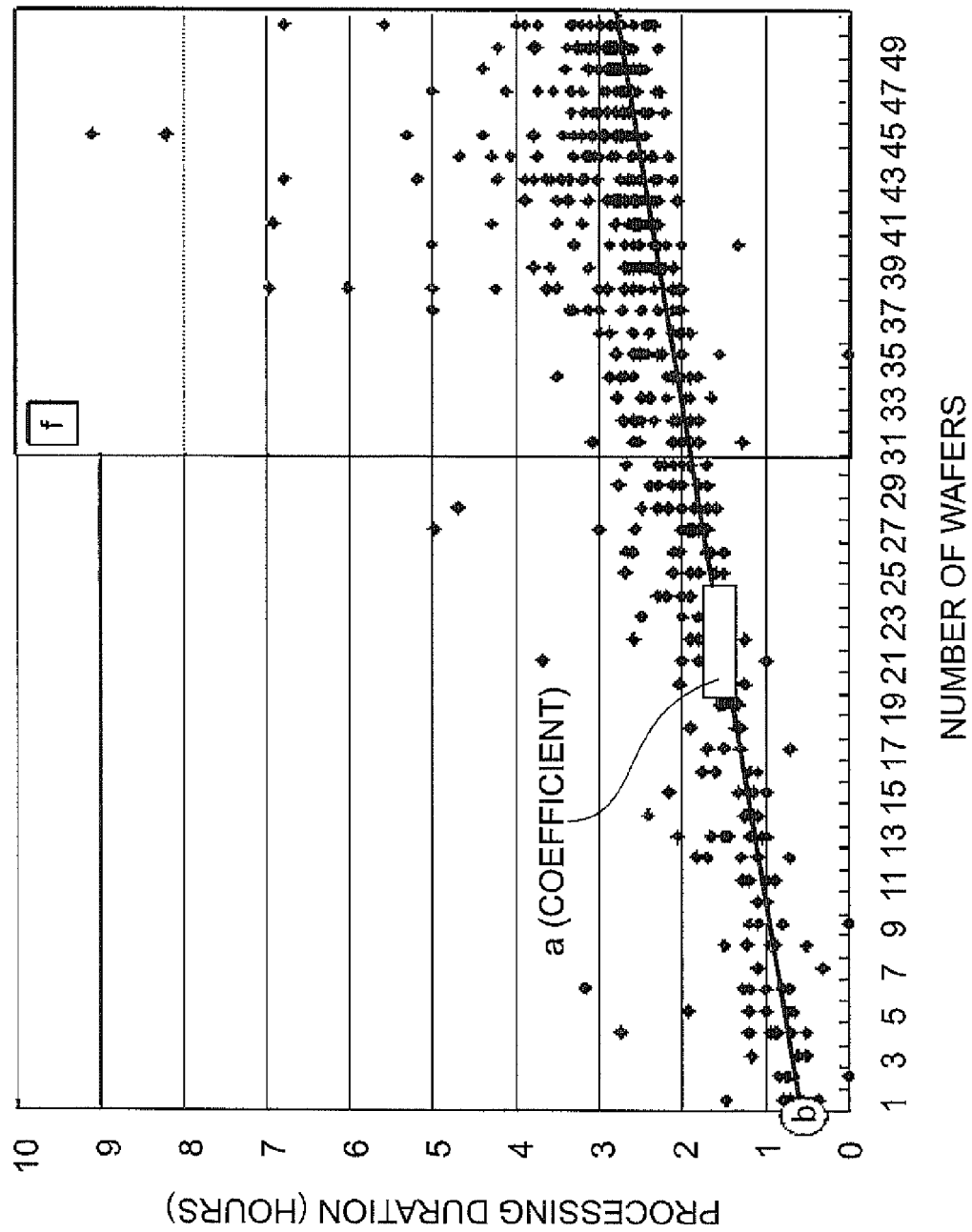
FIG. 5 is a distribution plot representing principal memory contents of an equipment and recipe-classified processing results database relating to the exemplary embodiment as two-dimensional co-ordinates.

The equipment and recipe-classified processing results database DB3 relating to the present exemplary embodiment is constructed by two-dimensional co-ordinates being stored in the database area DB for each type of equipment name data and each type of recipe data. With the wafer counts represented by the wafer count data and processing durations stored in the processing results database DB1 as objects, the wafer count data is represented by x co-ordinates and the processing durations corresponding to the wafer count data records are represented by y co-ordinates. FIG. 5 shows an example of a distribution plot illustrating a distribution of two-dimensional co-ordinates stored in the equipment and recipe-classified processing results database DB3.

Now, operation of the fabrication support device 10 relating to the present exemplary embodiment is described.

Figure 6:
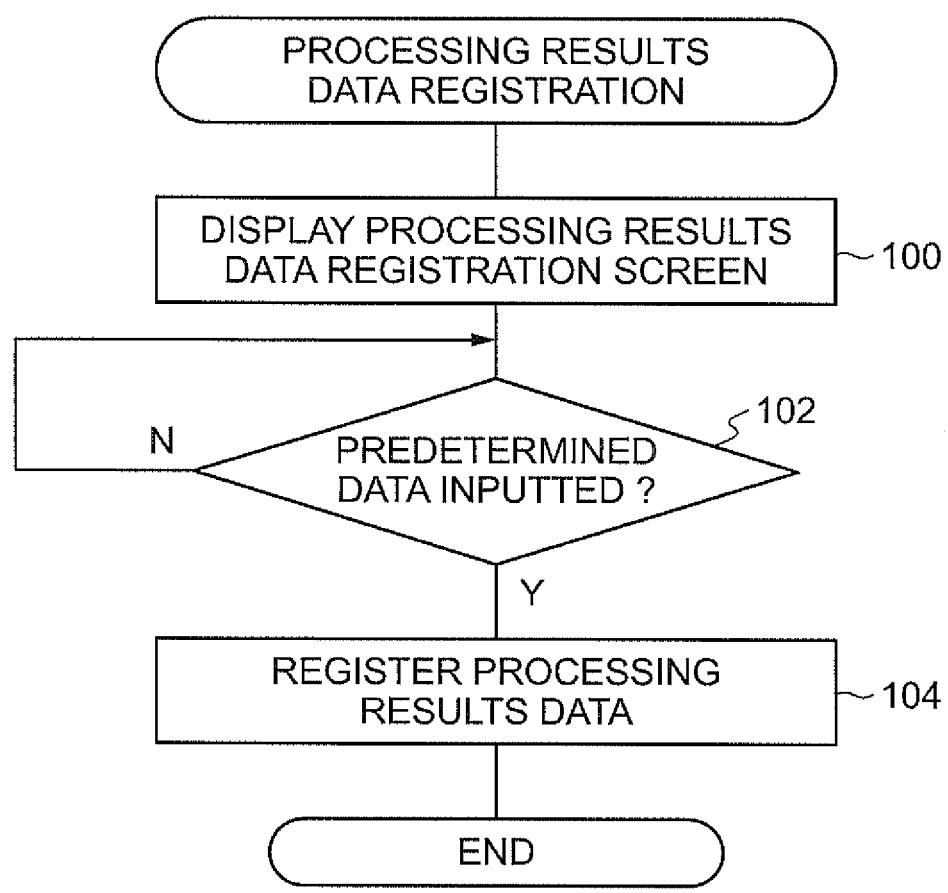
FIG. 6 is a flowchart illustrating the flow of processing of a processing results registration program relating to the exemplary embodiment.

Firstly, operation of the fabrication support device 10 when processing results data is being registered by a fabrication line administrator is described with reference to FIG. 6. FIG. 6 is a flowchart illustrating the flow of processing of a processing results data registration program that is executed by the CPU 10A of the fabrication support device 10 when an instruction to register processing results data is given to the fabrication support device 10 by the administrator. This program is stored in advance in the program area PG of the hard disc 10D.

In step 100 of FIG. 6, the administrator inputs data with the input device 10E to cause the display of a processing results data registration screen. Accordingly, the CPU 10A displays the processing results data registration screen at the display 10F and, in step 102, waits for the input of predetermined data through the input device 10E.

FIG. 7 illustrates an example of the processing results data registration screen that is displayed at the display 10F. As illustrated in FIG. 7, in the processing results data registration screen relating to the present exemplary embodiment, a message prompting the input of processing results data is displayed, and names of items that can be registered are displayed along with rectangular boxes for inputting the processing results data corresponding to those items.

When the processing results data registration screen is displayed at the display 1 OF as illustrated in FIG. 7, the administrator inputs processing results data in the boxes corresponding to the fields into which processing results data should be inputted, with the input device 10E. When the input is complete, the administrator selects an "End" button displayed at the bottom of the processing results data registration screen with the mouse (pointing device) included in the input device 10E or the like. The administrator must input processing results data of any items belonging to required fields. The items belonging to required fields in the example in FIG. 7 are the processing start data, the processing end data, the equipment name data, the wafer count data and the recipe data. The processing duration is calculated by the CPU 10A when input of both the processing start data and the processing end data is complete, and is entered into the box of the corresponding item. FIG. 7 illustrates an example in which 1 hour, 9 minutes (1:09) is entered.

When the "End" button is selected by the administrator, the result of the judgment in step 102 is positive and the CPU 10A proceeds to step 104.

In step 104, the CPU 10A associates the processing start data, processing end data, equipment name data, wafer count data, recipe data and processing duration that have been inputted into the processing results data registration screen by the administrator with one another and registers these in the hard disc 10D. Thus, the processing results database DB1 is constructed by the inputted processing start data, processing end data, equipment name data, wafer count data, recipe data and processing duration at the processing results data registration screen by the administrator being mutually associated and stored in the database area DB. When the processing of step 104 is finished, the CPU 10A ends the present processing results data registration program.

The processing results database DB1 illustrated in FIG. 3 is progressively constructed by execution of the above-described processing results data registration program.

Figure 8:
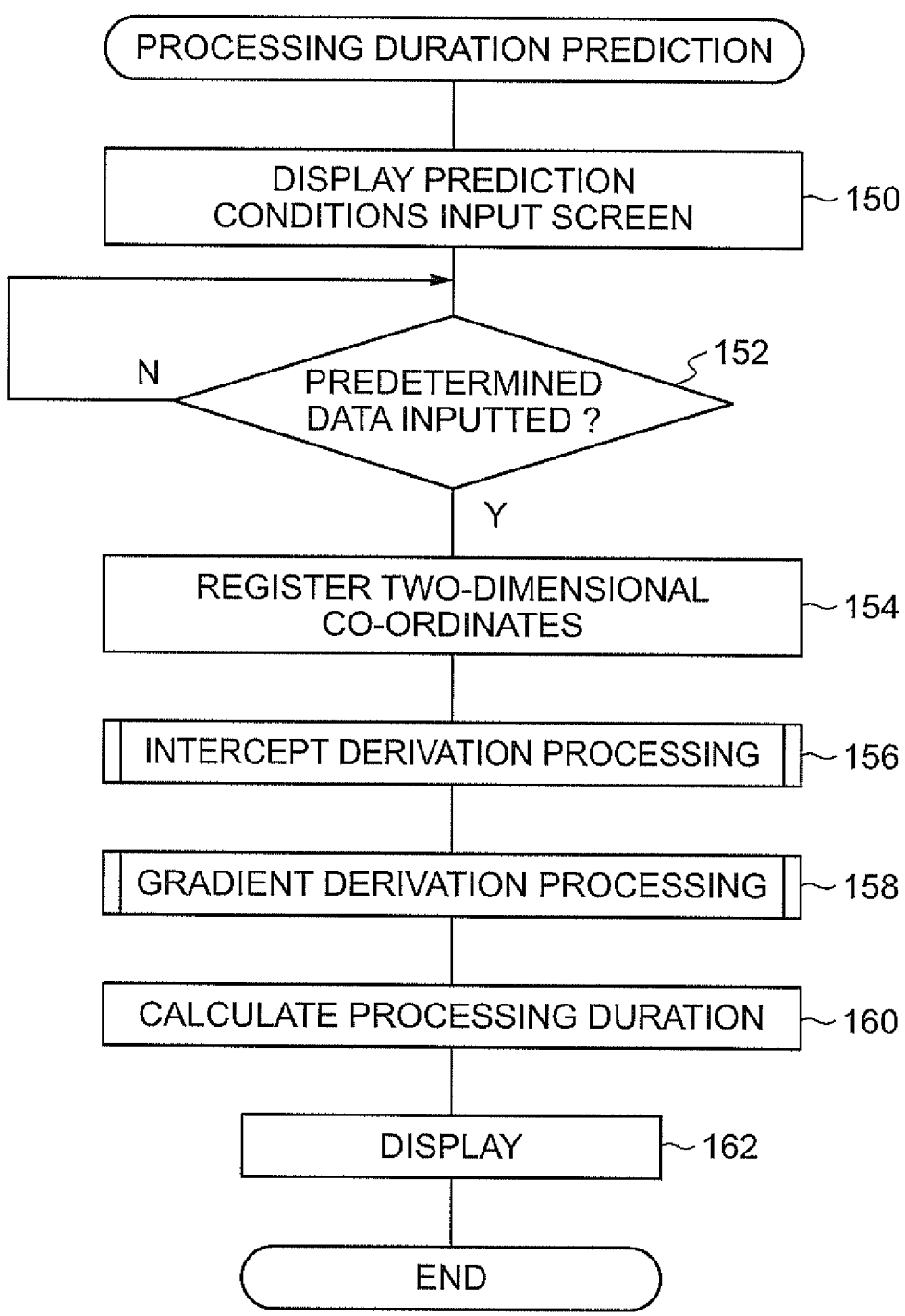
FIG. 8 is a flowchart illustrating the flow of processing of a processing duration prediction routine program relating to the exemplary embodiment.

Now, operation of the fabrication support device 10 when execution of processing duration prediction processing that predicts a duration of processing by specific equipment is required is described with reference to FIG. 8. FIG. 8 is a flowchart illustrating the flow of processing of a processing duration prediction program that is executed by the CPU 10A of the fabrication support device 10 when an instruction to execute the processing duration prediction is given to the fabrication support device 10 by an administrator. This program is stored in advance in the program area PG of the hard disc 10D.

In step 150 of FIG. 8, the administrator inputs data with the input device 10E to cause the display of a prediction conditions input screen. Accordingly, the CPU 10A displays the prediction conditions input screen at the display 10F and, in step 152, waits for the input of predetermined data through the input device 10E.

FIG. 9 illustrates an example of the prediction conditions input screen that is displayed at the display 10F. As illustrated in FIG. 9, in the prediction conditions input screen relating to the present exemplary embodiment, a message prompting the input of conditions for predicting the processing duration (processing conditions) is displayed, and names of items that can be inputted are displayed along with rectangular boxes for inputting the prediction conditions corresponding to those items.

When the prediction conditions input screen is displayed at the display 10F as illustrated in FIG. 9, the administrator inputs the prediction conditions in the boxes corresponding to the fields into which processing results data should be inputted with the input device 10E. When the input is complete, the administrator selects an "End" button displayed at the bottom of the prediction conditions input screen with the mouse (pointing device) included in the input device 10E or the like. The administrator must input prediction conditions of any items belonging to required fields. The items belonging to required fields in the example in FIG. 9 are the equipment name data, the wafer count data and the recipe data.

When the "End" button is selected by the administrator, the result of the judgment in step 152 is positive and the CPU I OA proceeds to step 154. In step 154, the CPU 10A reads the wafer count data and processing durations corresponding to the equipment name data inputted by the processing of step 152 from the processing results database DB1. The CPU 10A registers two-dimensional co-ordinates according to the wafer count data and processing durations that have been read out in the hard disc 10D. The CPU 10A also reads wafer count data and processing durations that correspond to both the equipment name data and the recipe data inputted by the processing of step 152 from the processing results database DB1, and registers two-dimensional co-ordinates according to these wafer count data and processing durations in the hard disc 10D. In other words, the CPU 10A constructs the equipment-classified processing results database DB2 by reading out the wafer count data and processing durations that correspond to the equipment name data inputted by the processing of step 152 from the processing results database DB1 and storing two-dimensional co-ordinates according to the read out wafer count data and processing durations in the database area DB for the individual type of equipment name data. In addition, the CPU 10A constructs the equipment and recipe-classified processing results database DB3 by reading out the wafer count data and processing durations that correspond to both the equipment name data and the recipe data inputted by the processing of step 152 from the processing results database DB1 and storing two-dimensional co-ordinates according to the read out wafer count data and processing durations in the database area DB for the individual combination of equipment name data and recipe data.

When the processing of step 154 is complete, the CPU 10A proceeds to step 156 and executes an intercept derivation routine program as follows, on the basis of the equipment-classified processing results database DB2.

Figure 10:
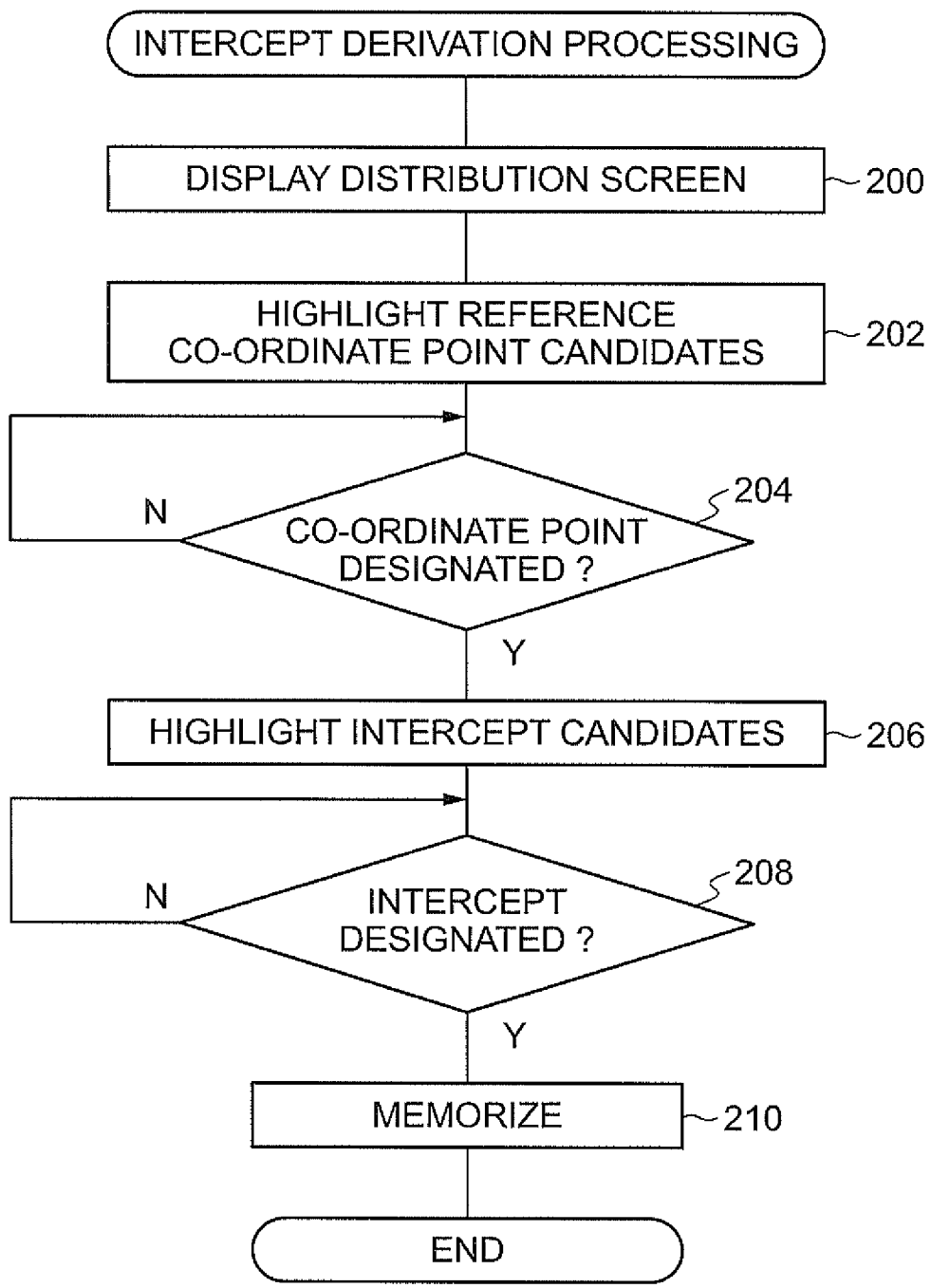
FIG. 10 is a flowchart illustrating the flow of processing of an intercept derivation routine program relating to the exemplary embodiment.

FIG. 10 is a flowchart illustrating the flow of processing of the intercept derivation routine program. In step 200 of FIG. 10, the CPU 10A displays the two-dimensional co-ordinates stored in the equipment-classified processing results database DB2 at the display 10F in the form of, for example, a distribution plot as illustrated in FIG. 4. The lines b, d and e shown in FIG. 4 are not displayed on the display 10F at this time. In the example of FIG. 4, the numbers of semiconductor wafers represented by the wafer count data are shown on the horizontal axis (hereinafter referred to as the x-axis), and the processing durations are shown on the vertical axis (hereinafter referred to as the y-axis). Herebelow, where appropriate for description, a number of semiconductor wafers represented by the wafer count data is referred to as a wafer count X, and a processing duration is referred to as a processing duration Y.

Then, in step 202, the CPU 10A extracts co-ordinate points that satisfy a first predetermined condition from the respective points (co-ordinate points) of the two-dimensional co-ordinates represented by the distribution plot that is currently being displayed at the display 10F. The CPU 10A then highlights the extracted co-ordinate points in the display 10F by changing them to a display condition (for example, an inverted display condition) that may distinguish them from the rest of the co-ordinate points as being candidates for a reference co-ordinate point.

In the processing of step 202 in the present exemplary embodiment, the first predetermined condition is the conditions that a co-ordinate point has a maximum value of the wafer counts X and that the processing duration Y falls in a first duration band. Here, the meaning of the term "first duration band" refers to a band of the processing durations of the co-ordinate points being displayed in the distribution plot at the display 10F by the processing of step 200 whose wafer counts X are the maximum value (in the example in FIG. 4, the wafer count X=50). The first duration band is a band of processing durations of co-ordinate points among these co-ordinate points whose positions, counting from a minimum processing duration, are proportions, relative to the total number of co-ordinate points whose wafer counts X are the maximum value (hereinafter referred to as first proportions), of from 5% to 35%. In the fabrication support device 10, to enable a more accurate prediction of a processing duration, it is preferable if the first proportions are from 10% to 20%. For example, in the distribution plot illustrated in FIG. 4, the number of co-ordinates corresponding to wafer count X=50 is 100. Therefore, among the co-ordinate points with wafer count X=50 in this case, a duration band of the processing durations Y of the co-ordinate points from a minimum value at 10% counting from the minimum processing duration Y (i.e., the 10th co-ordinate point) to a maximum value at 20% (i.e., the 20th co-ordinate point) may be employed as the first duration band.

Figure 11:
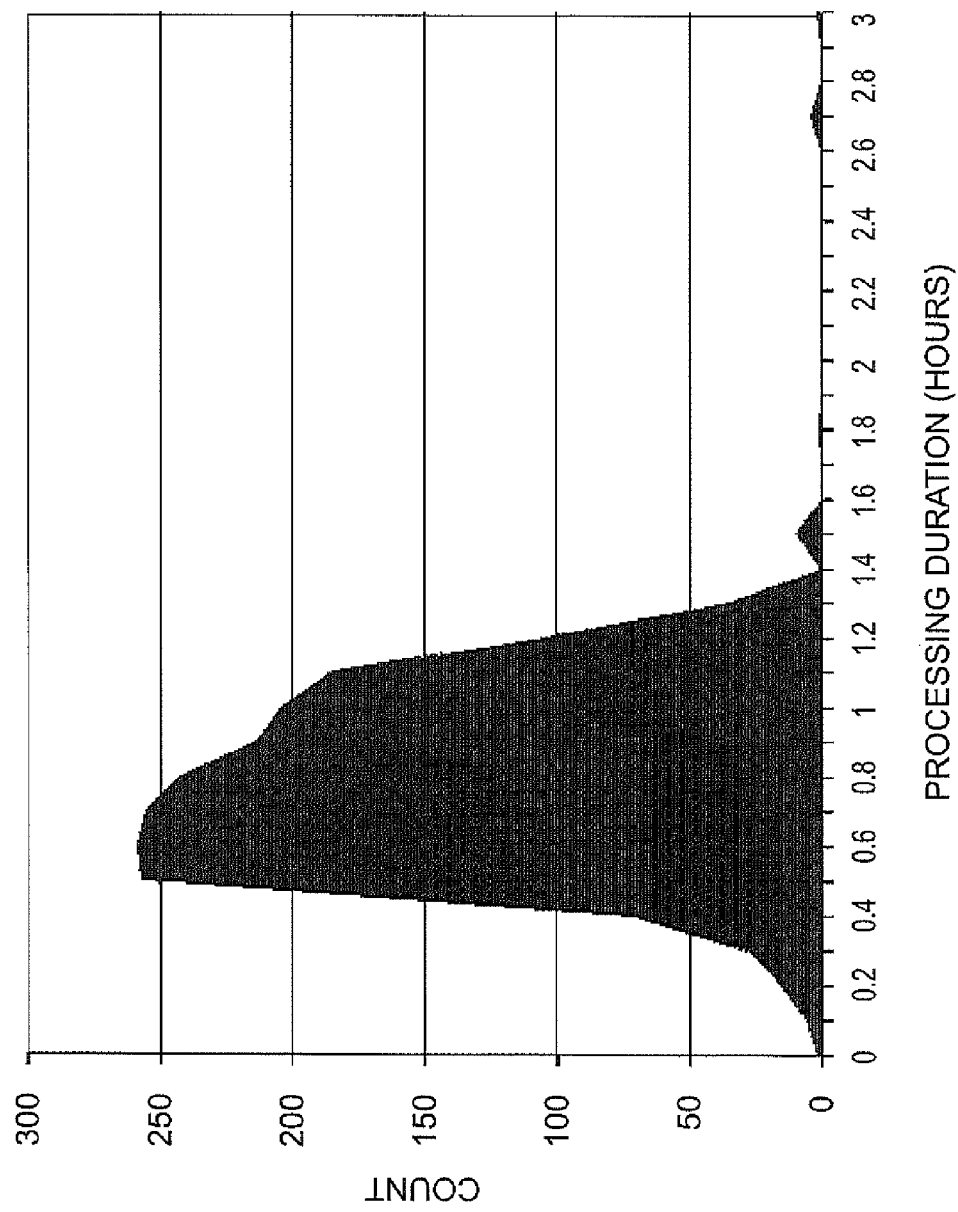
FIG. 11 is a graph illustrating a correlation between processing durations calculated from processing start data and processing end data, which are inputted by an administrator in order to construct the processing results database relating to the exemplary embodiment, and counts of such inputs.

FIG. 11 is a graph illustrating a correlation between the processing durations Y calculated from the processing start data and processing end data that have been inputted for constructing the processing results database DB1 (the horizontal axis in the example in FIG. 11) and the number of times individual inputs in which the processing start data and processing end data required for calculating a particular processing duration have been inputted by administrators (the vertical axis in the example in FIG. 11). As illustrated in FIG. 11, many unusual data points, due to input errors and the like, are present in the vicinity of a minimum value of the processing duration Y (the vicinity of the origin) and the vicinity of a maximum value. Accordingly, on a practical level, the present inventors have previously observed as a result of diligent investigations based on empirical rules that it is preferable if the proportions relative to the total number of co-ordinate points are from 5% to 35% (from 0.4 hours to 0.6 hours in the example in FIG. 11). If a processing duration Y included at a co-ordinate point should be employed as an ultimate forecast result with a higher level of reliability, the present inventors have previously observed as a result of diligent investigations based on empirical rules that it is preferable if the proportions relative to the total number of co-ordinate points are from 10% to 20% (in the example in FIG. 11, the processing duration Y at which the number of inputs is at the maximum and processing durations Y in the vicinity thereof).

Then, in step 204, the administrator uses the input device 10E (for example, the mouse) to designate one of the reference co-ordinate point candidates highlighted in the display 10F by the processing of step 202. In the example shown in FIG. 4, the co-ordinate points that are the reference co-ordinate point candidates are displayed in a cluster in the display 10F. Accordingly, in the present exemplary embodiment, by operating the keyboard and/or mouse included at the input device 10E, the administrator can easily instruct that a predetermined region containing the co-ordinate points currently highlighted in the display 10F should be displayed magnified. In the example shown in FIG. 4, the co-ordinate point "c" is designated as the reference co-ordinate point. The highlighted display state of co-ordinate points other than the designated reference co-ordinate point c is cancelled.

When the administrator designates the reference co-ordinate point c by the processing of step 204, the result of the judgment is positive and the CPU 10A proceeds to step 206. In step 206, the CPU 10A extracts intercepts that satisfy a second predetermined condition from intercepts of lines (straight lines, as are other lines mentioned hereinafter) that pass through the reference co-ordinate point c designated by the processing of step 204 and co-ordinate points that, as illustrated by the example in FIG. 4, are in a region bounded by: a line "e" that passes through the reference co-ordinate point c and is parallel to the x-axis; the y-axis; and a line "d" that passes through the reference co-ordinate point c and the origin. The CPU 10A then highlights co-ordinate points corresponding to the extracted segment in the display 10F as intercept candidates, by switching these co-ordinate points to a display state that may be distinguished from the rest of the co-ordinate points (for example, a display state with a color different from the color of the other co-ordinate points).

In the processing of step 206 in the present exemplary embodiment, the second predetermined condition is a condition that, counting the intercept candidate co-ordinate points highlighted in the display 10F from a minimum value, the positions of intercept candidate co-ordinate points are proportions, relative to the total number of intercepts of the lines passing through the reference co-ordinate point c and the respective co-ordinate points in the region bounded by line e, the y-axis and line d (referred to hereinafter as second proportions), in a range from 5% to 35%. The present inventors have previously observed as a result of diligent investigations based on empirical rules that employing the range from 5% to 35% counting from the minimum value as the second proportions is excellent. The present inventors have also previously observed as a result of diligent investigations based on empirical rules that it is preferable if the second proportions are from 10% to 20%.

Then, in step 208, the administrator uses the input device 10E (for example, the mouse) to designate one of the intercept candidate co-ordinate points highlighted in the display 10F by the processing of step 206. In the example shown in FIG. 4, the co-ordinate points that are intercept candidates are displayed in a cluster in the display 10F. Accordingly, in the present exemplary embodiment, by operating the keyboard and/or mouse included at the input device 10E, the administrator can easily instruct that a predetermined region containing the co-ordinate points currently highlighted in the display 10F should be displayed magnified. In the example shown in FIG. 4, the co-ordinate point "b" is designated as an intercept co-ordinate point to be ultimately used, and the highlighted display state of the other co-ordinate points is cancelled.

When the administrator designates the co-ordinate point b by the processing of step 208, the result of the judgment is positive and the CPU 10A proceeds to step 210. In step 210, the CPU 10A stores the co-ordinate point b designated by the processing of step 208 in a predetermined memory area of the hard disc 10D as a fixed value for the equipment represented by the equipment name data that has been inputted as a prediction condition. Then the CPU 10A ends the present intercept derivation routine program and proceeds to step 158 shown in FIG. 8.

In step 158, the CPU 10A executes a gradient derivation routine program as follows, based on the equipment and recipe-classified processing results database DB3.

Figure 12:
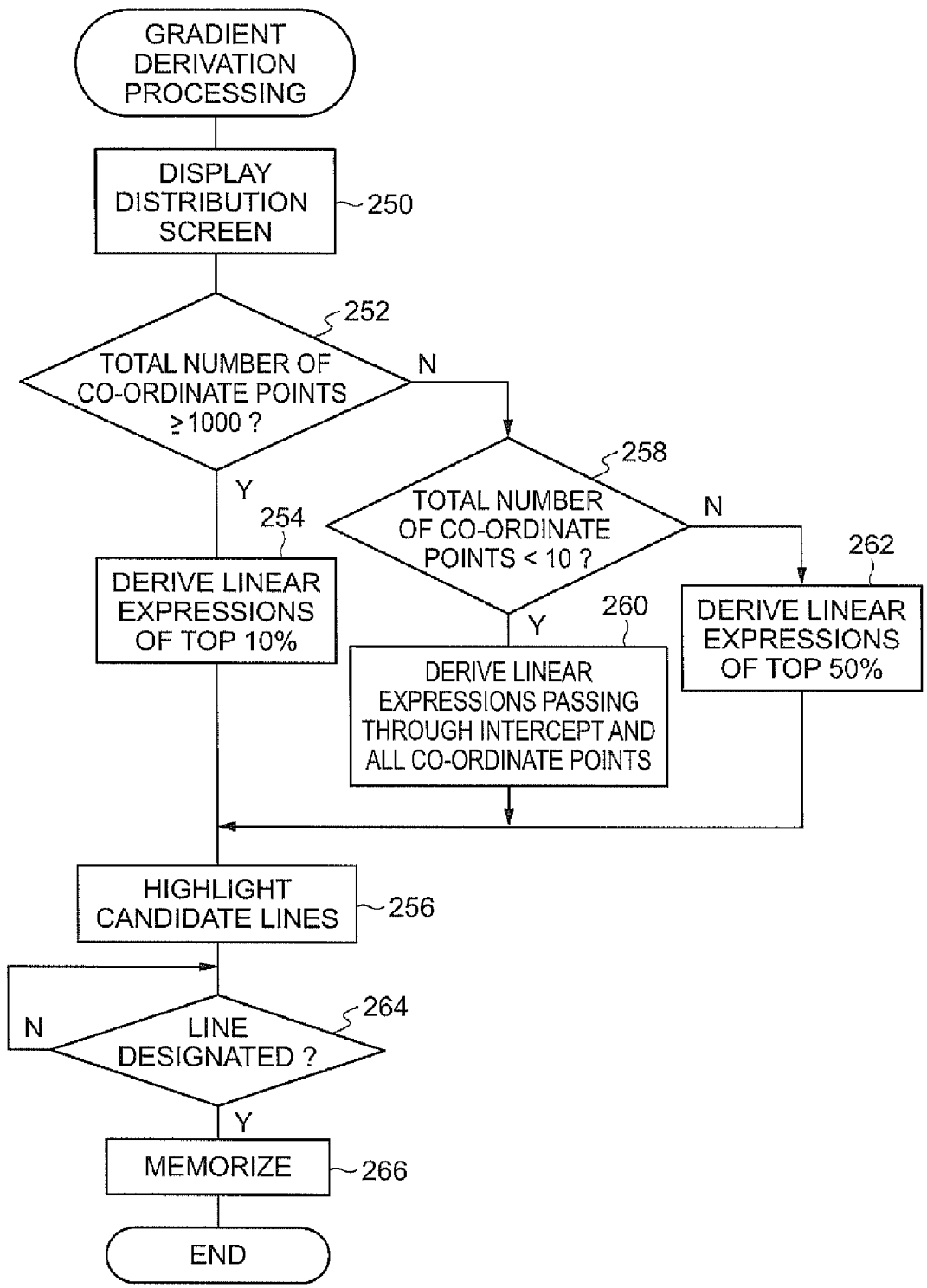
FIG. 12 is a flowchart illustrating the flow of processing of a gradient derivation routine program relating to the exemplary embodiment.

FIG. 12 is a flowchart illustrating the flow of processing of the gradient derivation routine program. In step 250 of FIG. 12, the CPU 10A displays the two-dimensional co-ordinates stored in the equipment and recipe-classified processing results database DB3 at the display 10F in the form of, for example, a distribution plot as illustrated in FIG. 5. The linear graph shown in FIG. 5 is not displayed at the display 10F at this time. In the example of FIG. 4, the same as in FIG. 4, the wafer count X is shown on the horizontal axis (the x-axis) and the processing duration Y is shown on the vertical axis (the y-axis).

Then, in step 252, the CPU 10A determines whether or not the total number of co-ordinate points present in the distribution plot displayed at the display 10F is 1,000 or more. If the result of the judgment is positive, the CPU 10A proceeds to step 254, derives mathematical expressions, and then proceeds to step 256. The expressions (first-order relationships based on the wafer count X and the predetermined duration Y) represent straight lines passing through the intercept b stored in the predetermined memory area of the hard disc 10D by the processing of step 156 and each of co-ordinate points in the top 10%, counting from higher wafer counts X, of the total number of co-ordinate points in the distribution plot displayed at the display 10F.

On the other hand, if the result of the judgment of step 252 is negative, the CPU 10A proceeds to step 258 and determines whether or not the total number of co-ordinate points present in the distribution plot displayed at the display 10F is 10 or less. If the result of the judgment in step 258 is positive, the CPU 10A proceeds to step 260, derives mathematical expressions, and then proceeds to step 256. The expressions (first-order relationships based on the wafer count X and the predetermined duration Y) represent straight lines passing through the co-ordinate point (intercept) b stored in the predetermined memory area of the hard disc 10D by the processing of step 156 and each of all the co-ordinate points in the distribution plot displayed at the display 10F.

On the other hand, if the result of the judgment of step 258 is negative, the CPU 10A proceeds to step 262, derives mathematical expressions, and then proceeds to step 256. The expressions (first-order relationships based on the wafer count X and the predetermined duration Y) represent straight lines passing through the co-ordinate point (intercept) b stored in the predetermined memory area of the hard disc 10D by the processing of step 156 and each of co-ordinate points in the top 50%, counting from higher wafer counts X, of the total number of co-ordinate points in the distribution plot displayed at the display 10F. In the example shown in FIG. 5, the co-ordinate points contained in the region "f" show the co-ordinate points in the top 50%, counting from high wafer counts X, of the total number of co-ordinate points present in the distribution plot displayed at the display 10F.

In step 256, the CPU 10A displays at the display 10F, of the lines represented by the mathematical expressions derived by the processing of step 254, step 260 or step 262, lines other than lines with a gradient of less than zero. In addition, the CPU 10A highlights in the display 10F, of the display object lines, lines with a gradient that satisfies a third predetermined condition, such that these lines may be distinguished from other lines. The third predetermined condition in step 256 is a condition that, of the gradients of all the lines displayed in accordance with the expressions derived by the processing of step 254, step 260 or step 262, gradients are in a range from 10% to 40% counting from the smallest gradient. The present inventors have previously observed as a result of diligent investigations based on empirical rules that employing the range 10% to 40% counting from the smallest value of gradients among all the lines is excellent. The present inventors have also previously observed as a result of diligent investigations based on empirical rules that it is preferable if the third condition is that, among the gradients of all the lines displayed in accordance with the expressions derived by the processing of step 254, step 260 or step 262, gradients are in a range from 10% to 20% counting from the smallest gradients.

Then, in step 264, the administrator uses the input device 10E (for example, the mouse) to designate one of the lines highlighted in the display 10F by the processing of step 256. In the present exemplary embodiment, the administrator can easily instruct with the mouse that a predetermined region containing the lines currently highlighted in the display 10F should be displayed magnified. In the example shown in FIG. 5, a line with the gradient (coefficient) "a" is designated as a line to be ultimately used for predicting a processing duration Y.

When a line is designated by the processing of step 264, the result of the judgment is positive, the CPU 10A proceeds to step 266, and the gradient a of the line designated by the processing of step 264 is stored in a predetermined memory area of the hard disc 10D. Then the CPU 10A ends the present gradient derivation routine program and proceeds to step 160 shown in FIG. 8.

In step 160, the CPU 10A calculates a processing duration using the line derived by the processing of step 264. That is, the CPU 10A calculates the processing duration by substituting a wafer count X represented by the wafer count data that was inputted by the processing of step 152 into a mathematical expression (1). Expression (1) is a regression equation in which the wafer count X is an independent variable and the predetermined duration Y is a dependent variable. The expression (1) includes the gradient a stored in the predetermined memory area of the hard disc 10D by the processing of step 266, and uses the co-ordinate point b stored in the predetermined memory area of the hard disc 10D by the processing of step 210 as an intercept. In the present exemplary embodiment, "a" in expression (1) is a coefficient corresponding approximately to a processing duration for one wafer, and "b" is a value particular to each piece of equipment and represents a particular duration required for processing a lot (for example, a wafer alignment duration required for processing of the first wafer in a lot, a duration required for vacuum suction, a preparatory task duration that occurs regardless of a number of wafers to be processed, and the like).

$$Y = aX + b \qquad (1)$$

Then, in step 162, the CPU 10A displays the processing duration Y obtained from the calculation by the processing of step 160 at the display 10F. For example, as illustrated in FIG. 13, the CPU 10A displays on the display 10F that the duration forecast as a processing duration for one lot (a processing scheduled duration) is 2 hours, 56 minutes (2:56). After the processing scheduled duration is displayed at the display 10F in this manner, the CPU 10A ends the present processing duration prediction program. Thus, in the fabrication support device 10 relating to the present exemplary embodiment, a processing duration may be easily and accurately predicted by executing the processing duration prediction program.

As is described in detail hereabove, according to the fabrication support device 10 relating to the present exemplary embodiment, the equipment-classified processing results database DB2, in which wafer counts X for individual lots of semiconductors to which predetermined processing is applied by a predetermined piece of equipment and processing durations Y required for processing the wafer counts X are represented by co-ordinate points in two dimensions, and the equipment and recipe-classified processing results database DB3, in which wafer counts X in individual recipes at each piece of equipment and processing durations Y required for processing of the wafer counts X are represented by co-ordinate points in two dimensions, are stored in the hard disc 10D. An intercept b of a regression equation is derived, which regression equation is represented by expression (1) in which the wafer count X is the independent variable, the processing duration Y is the dependent variable, and b is the intercept and a the gradient particular to the piece of equipment. That is, of the co-ordinate points represented by the equipment-classified processing results database DB2, an intercept b that satisfies the second predetermined condition is derived from among intercepts of straight lines that pass through a reference co-ordinate point c that satisfies the first predetermined condition and respective co-ordinate points in a region which is bounded by: a line e that passes through the reference co-ordinate point c and is parallel to the x-axis representing wafer counts X; the y-axis representing processing durations Y; and a line d that passes through the reference co-ordinate point c and the origin. Then, as the gradient a, among the co-ordinate points represented by the equipment and recipe-classified processing results database DB3, the gradient of a line that satisfies the third predetermined condition is derived from among gradients of lines that pass through the intercept b and each of all the co-ordinate points that have wafer counts X of at least a predetermined number. Then, the derived intercept b and gradient a are substituted into expression (1), which is used to calculate a processing duration Y, and processing at the predetermined piece of equipment is supported. Thus, applying processing to processing targets with a predetermined piece of equipment in accordance with a scheduled duration may be simply and accurately supported.

Therefore, an operator may be reliably placed at a predetermined work position at a lot processing end time, and wasted time at a fabrication line due to waiting for a person may be kept to a minimum. According to tests by the present inventors, person-waiting time has been in the region of 5% to 20% with the related art. In contrast, we have already seen that when the present invention is employed, an improvement of around 5% in availability (and sales) may be expected. Furthermore, because operators may be efficiently positioned to meet end times, an effect of reducing man-hours may be expected.

Problems and the like in conveyance systems, process systems and the like may be detected for respective lot processes from the calculated processing durations Y. Furthermore, by SPC management of fine timing variations based on the processing durations Y, problems may be quickly detected and the spread of trouble may be prevented.

In the exemplary embodiment described above, an example is described in which a co-ordinate point and a line displayed at the display 10F are designated by the administrator through the input device 10E. However, rather than being designated by an administrator, a single co-ordinate point and a single line may be extracted and used by the CPU 10A in accordance with predetermined algorithms. For example, an example may be given in which, if there are plural co-ordinate points included in the first duration band described above, a single co-ordinate point that is obtained by a predetermined algorithm from these co-ordinate points (for example, random extraction) is used. Further, there is an example in which a single line that is obtained by a predetermined algorithm (for example, random extraction) from the lines highlighted in the display 10F in the processing of the above-described step 256 is used.

In the exemplary embodiment described above, an example in which processing durations are calculated and the processing results database DB I is constructed on the basis of data provided by manual input by an administrator, in which large errors are likely to occur, is described. However, when constructing the processing results database DB1, processing durations may be calculated using time data that is reported by computer processing from a piece of equipment. Alternatively, a processing start signal representing a start of processing and a processing end signal representing the end of processing may be respectively received and a processing duration calculated from the reception interval. Further, both processing durations that are calculated from data provided by manual input by an administrator and processing durations that are calculated from data reported by processing by computers from equipment may be used for construction of the processing results database DB1. The present invention may moderate a reduction in reliability of scheduled processing durations that are calculated using a processing results database DB1 constructed on the basis of data obtained by manual input by an administrator. Therefore, the present invention is more likely to provide a large effect than when scheduled processing durations are calculated using a processing results database DB1 constructed on the basis of data reported by the processing of computers.

In the above exemplary embodiment, an example is described in which the scheduled processing duration is displayed at the display 10F. However, this is not limiting. A scheduled processing duration may be audibly expressed by a voice reproduction device. A scheduled processing duration may also be presented to be permanently visible by a printer. Furthermore, combinations of visual display by the display 10F, audible expression by a voice reproduction device and permanently visible display by a printer are possible.

In the above exemplary embodiment, administrators compare scheduled processing durations displayed at the display 10F with ideal processing durations and make changes to recipes, changes to numbers of semiconductor wafers to be fabricated and the like. However, an ideal processing duration may be inputted to the fabrication support device 10 in advance and, for example, a warning may be given through the display 10F if a difference between a calculated scheduled processing duration and the ideal processing duration is more than a predetermined duration. A means for giving the warning is not limited to the display 10F but may be another output device such as a voice reproduction device or a printer or the like.

In the above exemplary embodiment, an example is described of calculating a scheduled duration required for processing semiconductor wafers. However, this is not limiting. For example, after processing begins, a time at which the silicon wafers are conveyed by a conveyance device such as a conveyor belt or the like and arrive at a predetermined position (a scheduled arrival time) may be calculated. For example, an example may be given in which a time that is obtained by adding a scheduled processing duration calculated by the processing of step 160 to a processing start time represented by the processing start data inputted as illustrated in FIG. 7 is employed as a scheduled arrival time. As illustrated by the example in FIG. 14, an administrator may easily ascertain the scheduled arrival time by the scheduled arrival time calculated in this manner being displayed at the display 10F. Thus, spare time going to waste in a fabrication line may be minimized and availability may be improved by optimizing batch processing (deciding whether to wait for lots to meet up and form a batch or to carry out processing without waiting), for example, in a diffusion furnace. Furthermore, lot processing may be held up by periodic maintenance of a fabrication line, which may lead to great delays, particularly of urgent lot processing and the like. However, because arrival times may be accurately predicted, flexibility in maintenance operation plans may be improved and time losses moderated.

Figure 15:
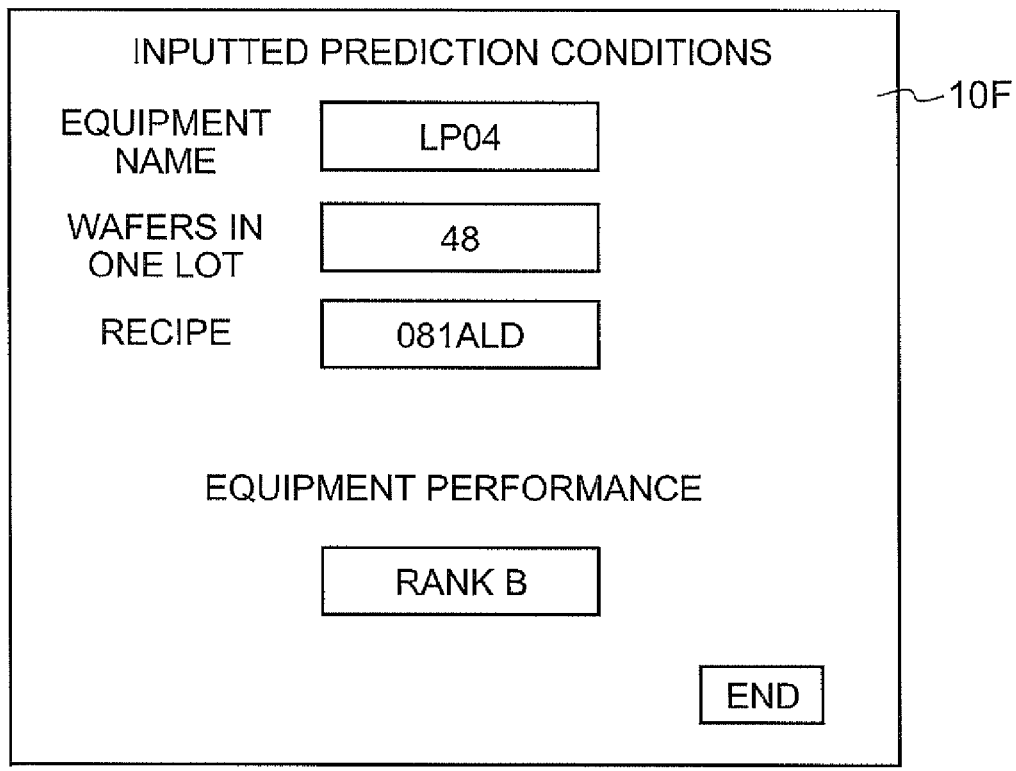
FIG. 15 is a (third) schematic diagram illustrating an example of a display state of the display of the fabrication processing device relating to the exemplary embodiment.

The performance of a piece of equipment represented by equipment name data inputted to the fabrication support device 10 may be evaluated on the basis of a scheduled processing duration calculated by executing the processing duration prediction program. For example, there may be an example in which the extent to which a scheduled processing duration is slower than a processing duration actually measured at evaluation reference equipment is evaluated into multiple levels. This scheduled processing duration is calculated by inputting wafer count data and recipe data representing respective wafer counts and recipes that have been actually been processed by the evaluation reference equipment into the fabrication support device 10 and executing the processing duration prediction program. The meaning of the term "evaluated into multiple levels" as used herein includes, for example, evaluating a case in which there is no slowing in the scheduled processing duration calculated by the fabrication support device 10 relative to a processing duration actually measured at the evaluation reference equipment as being at rank A, evaluating a case in which there is a slowing of less than a minute in the scheduled processing duration calculated by the fabrication support device 10 relative to the processing duration actually measured at the evaluation reference equipment as being at rank B, and evaluating a case in which there is a slowing of more than a minute in the scheduled processing duration calculated by the fabrication support device 10 relative to the processing duration actually measured at the evaluation reference equipment as being at rank C. An evaluation result may be displayed at the display 10F, for example, as illustrated in FIG. 15. Thus, the risks of judging that processing is possible when it is not (missing deadlines and reducing sales) and, conversely, the risks of judging that processing is not possible when it is (lost orders and over-investment) may be avoided.

Using equipment represented by equipment name data inputted to the fabrication support device 10 as an evaluation target, relative to a total number of times the scheduled processing duration is calculated, a proportion of times that the processing scheduled direction and the actually measured processing duration match to within a predetermined error may be calculated, and this proportion may be displayed at the display 10F, as in the example illustrated in FIG. 16, as a degree of reliability of the scheduled processing durations. The above-described verification of equipment performance and verification of scheduled processing duration reliability may be carried out on the same equipment.

In the above exemplary embodiment, the method of derivation of the mathematical expression representing a straight line may be altered in accordance with the total number of co-ordinate points by the execution of the gradient derivation program. However, this is not limiting. Mathematical expressions (first-order relationships based on the wafer count X and the predetermined duration Y) that represent lines passing through the co-ordinate point b and each of the co-ordinate points in the top 50% of the total number of co-ordinate points counting from high wafer counts X may be derived regardless of the total number of co-ordinate points. Using the top 50% means that lines with high accuracy are drawn from data with high numbers of wafers. The present inventors have previously observed as a result of diligent investigations based on empirical rules that the top 50% will almost always be sufficient for obtaining accuracy.

In the above exemplary embodiment, an example is described of supporting fabrication of semiconductor wafers by substituting a wafer number X into expression (1) and calculating a processing duration Y. However, the present invention is not limited thus. There may be an example that supports fabrication of semiconductor wafers by substituting a processing duration Y into expression (1) and calculating a wafer number X.

In the above exemplary embodiment, an example is described of supporting fabrication of semiconductor wafers. However, the present invention may also be applied to supporting processing by predetermined equipment (for example, tempering machining devices, NC cutting machining devices and the like) that apply predetermined processing (for example, tempering, cutting or the like) to processing targets other than semiconductor wafers (for example, molded components). In these cases too, processing durations and numbers of processing targets that can be processed may be predicted in accordance with predetermined equipment in a similar manner to the above exemplary embodiment.

According to the second aspect of the present invention, in the processing support device according to the first aspect, the first predetermined condition may include conditions that the co-ordinate point is at a maximum value of the unit count X and the processing duration Y falls in a first duration band.

According to the third aspect of the present invention, in the second aspect, the first duration band may be processing durations Y, among the processing durations Y of co-ordinate points with the maximum value unit count X represented by the first two-dimensional co-ordinate data, of which positions counting from a minimum processing duration Y are proportions relative to a total number of the co-ordinate points with the maximum value unit count X of from 5% to 35%.

According to the fourth aspect of the present invention, in the third aspect, the proportions may be from 10% to 20%.

According to the fifth aspect of the present invention, in any one of the first to the fourth aspects, the second predetermined condition may include a condition that positions counting from a smallest intercept, among intercepts that are objects of judgment of whether or not the second predetermined condition is satisfied, are proportions relative to a total number of the judgment object intercepts of from 5% to 35%.

According to the sixth aspect of the present invention, in the fifth aspect, the proportion relative to the total number of intercepts that are objects of judgment of whether or not the second predetermined condition is satisfied may be from 10% to 20%.

According to the seventh aspect of the present invention, in any one of the first to the sixth aspects, the predetermined number may be a count of co-ordinate points with values in the top 50%, counting from larger unit count X values, among the co-ordinate points represented by the second two-dimensional co-ordinate data.

According to the eighth aspect of the present invention, in any one of the first to the eighth aspects, if the total number of co-ordinate points represented by the second two-dimensional co-ordinate data is 1,000 or more, the predetermined number may be a number of co-ordinate points with values in the top 10%, counting from larger unit count X values, among the co-ordinate points represented by the second two-dimensional co-ordinate data, if the total number of co-ordinate points represented by the second two-dimensional co-ordinate data is between 10 and 1,000, the predetermined number is a number of co-ordinate points with values in the top 50%, counting from larger unit count X values, among the co-ordinate points represented by the second two-dimensional co-ordinate data, and if the total number of co-ordinate points represented by the second two-dimensional co-ordinate data is 10 or less, the predetermined number is the total number.

According to the ninth aspect of the present invention, in the ninth aspect, the third predetermined condition may include a condition that a position counting from a smallest gradient, among gradients that are objects of judgment of whether or not the third predetermined condition is satisfied, is a proportion relative to a total number of the judgment object gradients of from 10% to 40%.

According to the tenth aspect of the present invention, in the ninth aspect, the proportion relative to the total number of gradients that are objects of judgment of whether or not the third predetermined condition is satisfied is from 10% to 20%.

According to the eleventh aspect of the present invention, in any one of the first to the tenth aspects, the support section may support the processing by substituting a unit count X into expression (1), into which the intercept b derived by the intercept derivation section and the gradient a derived by the gradient derivation section are substituted, and calculating the processing duration Y.

According to the twelfth aspect of the present invention, in any one of the first to eleventh aspects, the co-ordinate points are two-dimensional co-ordinate points according to unit counts X and processing durations Y indicated by an instructor who instructs the equipment to execute the processing.

According to the fourteenth aspect of the present invention, in the semiconductor fabrication support device according to the thirteenth aspect, the processing may include processing that conveys the semiconductors, and the prediction section may predict a time at which the semiconductors will arrive at a conveyance destination.

According to the fifteenth aspect of the present invention, in the thirteenth or the fourteenth aspect, the prediction section may predict a processing duration Y using the support section, and the semiconductor fabrication support device may further include a verification section that, using the processing duration Y predicted by the prediction section, performs at least one of a verification of performance of the equipment and a verification of a duration that is actually required for the processing.

According to the seventeenth aspect of the present invention, in the processing support method according to the sixteenth aspect, the first predetermined condition may include conditions that the co-ordinate point is at a maximum value of the unit count X and the processing duration Y falls in a first duration band.

According to the eighteenth aspect of the present invention, in the seventeenth aspect, the first duration band may be processing durations Y, among the processing durations Y of co-ordinate points with the maximum value unit count X represented by the first two-dimensional co-ordinate data, of which positions counting from a minimum processing duration Y are proportions relative to a total number of the co-ordinate points with the maximum value unit count X of from 5% to 35%.

According to the nineteenth aspect of the present invention, in the eighteenth aspect, the proportions may be from 10% to 20%.

According to the twentieth aspect of the present invention, in any one of the seventeenth to the nineteenth aspect, the second predetermined condition may include a condition that positions counting from a smallest intercept, among intercepts that are objects of judgment of whether or not the second predetermined condition is satisfied, are proportions relative to a total number of the judgment object intercepts of from 5% to 35%.

According to the twenty-first aspect of the present invention, in the twentieth aspect, the proportion relative to the total number of intercepts that are objects of judgment of whether or not the second predetermined condition is satisfied may be from 10% to 20%.

According to the twenty-second aspect of the present invention, in any one of the sixteenth to the twenty-first aspects, the predetermined number may be a number of co-ordinate points with values in the top 50%, counting from larger unit count X values, among the co-ordinate points represented by the second two-dimensional co-ordinate data.

According to the twenty-third aspect of the present invention, in any one of the sixteenth to the twenty-first aspects, if the total number of co-ordinate points represented by the second two-dimensional co-ordinate data is 1,000 or more, the predetermined number may be a count of co-ordinate points with values in the top 10%, counting from larger unit count X values, among the co-ordinate points represented by the second two-dimensional co-ordinate data, if the total number of co-ordinate points represented by the second two-dimensional co-ordinate data is between 10 and 1,000, the predetermined number may be a number of co-ordinate points with values in the top 50%, counting from larger unit count X values, among the co-ordinate points represented by the second two-dimensional co-ordinate data, and if the total number of co-ordinate points represented by the second two-dimensional co-ordinate data is 10 or less, the predetermined number may be the total number.

According to the twenty-fourth aspect of the present invention, in any one of the sixteenth to the twenty-third aspects, the third predetermined condition may include a condition that a position counting from a smallest gradient, among gradients that are objects of judgment of whether or not the third predetermined condition is satisfied, may be a proportion relative to a total number of the judgment object gradients of from 10% to 40%.

According to the twenty-fifth aspect of the present invention, in the twenty fourth aspect, the proportion relative to the total number of gradients that are objects of judgment of whether or not the third predetermined condition is satisfied may be from 10% ,o 20%.

According to the twenty-sixth aspect of the present invention, in any one of the sixteenth to the twenty-fifth aspects, the supporting step may include supporting the processing by substituting a unit count X into expression (1), into which the derived intercept b and the derived gradient a are substituted, and calculating the processing duration Y.

According to the twenty-seventh aspect of the present invention, in any one of the sixteenth to the twenty-sixth aspects, the co-ordinate points may be two-dimensional co-ordinate points according to unit counts X and processing durations Y indicated by an instructor who instructs the equipment to execute the processing.

According to the twenty-ninth aspect of the present invention, in the semiconductor fabrication support method according to the twenty-eighth aspect, the processing may include conveyance of the semiconductors, and the predicting step may include predicting a time at which the semiconductors will arrive at a conveyance destination.

According to the thirtieth aspect of the present invention, in the semiconductor fabrication support method according to the twenty-eight or the twenty-ninth aspect, the predicting step may include predicting a processing duration Y, by the supporting step, and the semiconductor fabrication support method further includes performing, using the processing duration Y predicted by the predicting step, at least one of a verification of performance of the equipment and a verification of a duration that is actually required for the processing.

What is claimed is:

1. A processing support device comprising:
   a processor;
   a memory section that stores
      first two-dimensional co-ordinate data that represents
         processing object unit counts X of processing targets to which predetermined processing is applied by predetermined equipment and
         processing durations Y required for the processing of the unit counts X of the processing targets
      as co-ordinate points in two dimensions, and
      second two-dimensional co-ordinate data that represents unit counts X and processing durations Y for individual types of the processing as co-ordinate points in two dimensions;
   an intercept derivation section that derives, using the processor, an intercept b of a regression equation expressed as the following expression (1)

$$Y=aX+b \quad (1)$$

in which the unit count X is an independent variable, the processing duration Y is a dependent variable, and b is an intercept and a is a gradient particular to the equipment,
      the intercept b being an intercept that satisfies a second condition among intercepts of lines that pass through a reference co-ordinate point and respective co-ordinate points in a region,
      the reference co-ordinate point satisfying a first predetermined condition among the co-ordinate points represented by the first two-dimensional co-ordinate data stored in the memory section, and
      the region being bounded by
         a line that passes through the reference co-ordinate point and is parallel to an x-axis representing the unit counts X,
         a y-axis representing the processing durations Y and
         a line that passes through the reference co-ordinate point and the origin;
   a gradient derivation section that derives, using the processor, the gradient a, the gradient a being a gradient of a line that satisfies a third predetermined condition among gradients of lines that pass through
      the intercept b derived by the intercept derivation section and
      each of all co-ordinate points with a unit count X greater than or equal to a predetermined number among the co-ordinate points represented by the second two-dimensional co-ordinate data stored in the memory section; and
   a support section that supports, using the processor, the processing using expression (1), into which the intercept b derived by the intercept derivation section and the gradient a derived by the gradient derivation section are substituted, wherein the first predetermined condition includes conditions that the co-ordinate point is at a maximum value of the unit count X and the processing duration Y falls in a first duration band, and
   the first duration band is processing durations Y, among the processing durations Y of co-ordinate points with the maximum value unit count X represented by the first two-dimensional co-ordinate data, of which positions counting from a minimum processing duration Y are proportions relative to a total number of the co-ordinate points with the maximum value unit count X of from 5% to 35%.

2. The processing support device according to claim 1, wherein the proportions are from 10% to 20%.

3. A processing support device comprising:
   a processor;
   a memory section that stores
      first two-dimensional co-ordinate data that represents
         processing object unit counts X of processing targets to which predetermined processing is applied by predetermined equipment and
         processing durations Y required for the processing of the unit counts X of the processing targets
      as co-ordinate points in two dimensions, and
      second two-dimensional co-ordinate data that represents unit counts X and processing durations Y for individual types of the processing as co-ordinate points in two dimensions;
   an intercept derivation section that derives, using the processor, an intercept b of a regression equation expressed as the following expression (1)

$$Y=aX+b \quad (1)$$

in which the unit count X is an independent variable, the processing duration Y is a dependent variable, and b is an intercept and a is a gradient particular to the equipment,
      the intercept b being an intercept that satisfies a second condition among intercepts of lines that pass through a reference co-ordinate point and respective co-ordinate points in a region,
      the reference co-ordinate point satisfying a first predetermined condition among the co-ordinate points represented by the first two-dimensional co-ordinate data stored in the memory section, and
      the region being bounded by
         a line that passes through the reference co-ordinate point and is parallel to an x-axis representing the unit counts X,
         a y-axis representing the processing durations Y and
         a line that passes through the reference co-ordinate point and the origin;
   a gradient derivation section that derives, using the processor, the gradient a, the gradient a being a gradient of a line that satisfies a third predetermined condition among gradients of lines that pass through
      the intercept b derived by the intercept derivation section and
      each of all co-ordinate points with a unit count X greater than or equal to a predetermined number among the co-ordinate points represented by the second two-dimensional co-ordinate data stored in the memory section; and
   a support section that supports, using the processor, the processing using expression (1), into which the intercept b derived by the intercept derivation section and the gradient a derived by the gradient derivation section are substituted, wherein the second predetermined condition includes a condition that positions counting from a smallest intercept, among intercepts that are objects of judgment of whether or not the second predetermined condition is satisfied, are proportions relative to a total number of the judgment object intercepts of from 5% to 35%.

4. The processing support device according to claim 3, wherein the proportion relative to the total number of intercepts that are objects of judgment of whether or not the second predetermined condition is satisfied is from 10% to 20%.

5. The processing support device according to claim 1, wherein the predetermined number is a count of co-ordinate points with values in the top 50%, counting from larger unit count X values, among the co-ordinate points represented by the second two-dimensional co-ordinate data.

6. The processing support device according to claim 5, wherein
if the total number of co-ordinate points represented by the second two-dimensional co-ordinate data is 1,000 or more, the predetermined number is a number of co-ordinate points with values in the top 10%, counting from larger unit count X values, among the co-ordinate points represented by the second two-dimensional co-ordinate data,
if the total number of co-ordinate points represented by the second two-dimensional co-ordinate data is between 10 and 1,000, the predetermined number is a number of co-ordinate points with values in the top 50%, counting from larger unit count X values, among the co-ordinate points represented by the second two-dimensional co-ordinate data, and
if the total number of co-ordinate points represented by the second two-dimensional co-ordinate data is 10 or less, the predetermined number is the total number.

7. A processing support device comprising:
a processor;
a memory section that stores
first two-dimensional co-ordinate data that represents
processing object unit counts X of processing targets to which predetermined processing is applied by predetermined equipment and
processing durations Y required for the processing of the unit counts X of the processing targets
as co-ordinate points in two dimensions, and
second two-dimensional co-ordinate data that represents unit counts X and processing durations Y for individual types of the processing as co-ordinate points in two dimensions;
an intercept derivation section that derives, using the processor, an intercept b of a regression equation expressed as the following expression (1)

$$Y=aX+b \quad (1)$$

in which the unit count X is an independent variable, the processing duration Y is a dependent variable, and b is an intercept and a is a gradient particular to the equipment,
the intercept b being an intercept that satisfies a second condition among intercepts of lines that pass through a reference co-ordinate point and respective co-ordinate points in a region,
the reference co-ordinate point satisfying a first predetermined condition among the co-ordinate points represented by the first two-dimensional co-ordinate data stored in the memory section, and
the region being bounded by
a line that passes through the reference co-ordinate point and is parallel to an x-axis representing the unit counts X,
a y-axis representing the processing durations Y and
a line that passes through the reference co-ordinate point and the origin;
a gradient derivation section that derives, using the processor, the gradient a, the gradient a being a gradient of a line that satisfies a third predetermined condition among gradients of lines that pass through
the intercept b derived by the intercept derivation section and
each of all co-ordinate points with a unit count X greater than or equal to a predetermined number among the co-ordinate points represented by the second two-dimensional co-ordinate data stored in the memory section; and
a support section that supports, using the processor, the processing using expression (1), into which the intercept b derived by the intercept derivation section and the gradient a derived by the gradient derivation section are substituted,
wherein the third predetermined condition includes a condition that a position counting from a smallest gradient, among gradients that are objects of judgment of whether or not the third predetermined condition is satisfied, is a proportion relative to a total number of the judgment object gradients of from 10% to 40%.

8. The processing support device according to claim 7, wherein the proportion relative to the total number of gradients that are objects of judgment of whether or not the third predetermined condition is satisfied is from 10% to 20%.

9. The processing support device according to claim 1, wherein the support section supports, using the processor, the processing by substituting a unit count X into expression (1), into which the intercept b derived by the intercept derivation section and the gradient a derived by the gradient derivation section are substituted, and calculating, using the processor, the processing duration Y.

10. The processing support device according to claim 1, wherein the co-ordinate points are two-dimensional co-ordinate points according to unit counts X and processing durations Y indicated by an instructor who instructs the equipment to execute the processing.

11. A semiconductor fabrication support device comprising:
a processing support device according to claim 1; and
a prediction section that predicts an end time of processing using the support section,
wherein the processing targets are semiconductors.

12. The semiconductor fabrication support device according to claim 11, wherein
the processing includes processing that conveys the semiconductors, and
the prediction section predicts a time at which the semiconductors will arrive at a conveyance destination.

13. The semiconductor fabrication support device according to claim 11, wherein the prediction section predicts a processing duration Y using the support section, and
the semiconductor fabrication support device further includes a verification section that, using the processing duration Y predicted by the prediction section, performs at least one of a verification of performance of the equipment and a verification of a duration that is actually required for the processing.

14. A processing support method comprising:
registering, by storing in a memory section,
- first two-dimensional co-ordinate data that represents
  - processing object unit counts X of processing targets to which predetermined processing is applied by predetermined equipment and
  - processing durations Y required for the processing of the unit counts X of the processing targets
- as co-ordinate points in two dimensions, and
  - second two-dimensional co-ordinate data that represents unit counts X and processing durations Y for individual types of the processing as co-ordinate points in two dimensions;

deriving, using a processor, an intercept b of a regression equation expressed as the following expression (1)

$$Y=aX+b \qquad (1)$$

in which the unit count X is an independent variable, the processing duration Y is a dependent variable, and b is an intercept and a is a gradient particular to the equipment,
- the intercept b being an intercept that satisfies a second condition among intercepts of lines that pass through a reference co-ordinate point and respective co-ordinates in a region,
- the reference co-ordinate point satisfying a first predetermined condition among the co-ordinate points represented by the first two-dimensional co-ordinate data stored in the memory section, and
- the region being bounded by
  - a line that passes through the reference co-ordinate point and is parallel to an x-axis representing the unit counts X,
  - a y-axis representing the processing durations Y and
  - a line that passes through the reference co-ordinate point and the origin;

deriving, using the processor, the gradient a, the gradient a being a gradient of a line that satisfies a third predetermined condition among gradients of lines that pass through
- the derived intercept b and
- each of all co-ordinate points with a unit count X greater than or equal to a predetermined number among the co-ordinate points represented by the second two-dimensional co-ordinate data stored in the memory section; and supporting, using the processor, the processing using expression (1), into which the derived intercept b and the derived gradient a are substituted,
wherein the first predetermined condition includes conditions that the co-ordinate point is at a maximum value of the unit count X and the processing duration Y falls in a first duration band, and
the first duration band is processing durations Y, among the processing durations Y of co-ordinate points with the maximum value unit count X represented by the first two-dimensional co-ordinate data, of which positions counting from a minimum processing duration Y are proportions relative to a total number of the co-ordinate points with the maximum value unit count X of from 5% to 35%.

15. A semiconductor fabrication support method comprising:
a processing support method according to claim 14; and
predicting, using the processor, an end time of processing, by the supporting step,
wherein the processing targets are semiconductors.

16. A non-transitory computer readable medium storing a program causing a computer to execute a process for supporting processing, the process comprising:
registering, by storing in a memory section,
- first two-dimensional co-ordinate data that represents
  - processing object unit counts X of processing targets to which predetermined processing is applied by predetermined equipment and
  - processing durations Y required for the processing of the unit counts X of the processing targets
- as co-ordinate points in two dimensions, and
  - second two-dimensional co-ordinate data that represents unit counts X and processing durations Y for individual types of the processing as co-ordinate points in two dimensions;

deriving an intercept b of a regression equation expressed as the following expression (1)

$$Y=aX+b \qquad (1)$$

in which the unit count X is an independent variable, the processing duration Y is a dependent variable, and b is an intercept and a is a gradient particular to the equipment,
- the intercept b being an intercept that satisfies a second condition among intercepts of lines that pass through a reference co-ordinate point and respective co-ordinates in a region,
- the reference co-ordinate point satisfying a first predetermined condition among the co-ordinate points represented by the first two-dimensional co-ordinate data stored in the memory section, and
- the region being bounded by
  - a line that passes through the reference co-ordinate point and is parallel to an x-axis representing the unit counts X,
  - a y-axis representing the processing durations Y and
  - a line that passes through the reference co-ordinate point and the origin;

deriving the gradient a, the gradient a being a gradient of a line that satisfies a third predetermined condition among gradients of lines that pass through
- the derived intercept b and
- each of all co-ordinate points with a unit count X greater than or equal to a predetermined number among the co-ordinate points represented by the second two-dimensional co-ordinate data stored in the memory section; and supporting the processing using expression (1), into which the derived intercept b and the derived gradient a are substituted,
wherein the first predetermined condition includes conditions that the co-ordinate point is at a maximum value of the unit count X and the processing duration Y falls in a first duration band, and
the first duration band is processing durations Y, among the processing durations Y of co-ordinate points with the maximum value unit count X represented by the first two-dimensional co-ordinate data, of which positions counting from a minimum processing duration Y are proportions relative to a total number of the co-ordinate points with the maximum value unit count X of from 5% to 35%.

* * * * *